United States Patent
Rolfson et al.

Patent Number: 5,372,901
Date of Patent: Dec. 13, 1994

[54] REMOVABLE BANDPASS FILTER FOR MICROLITHOGRAPHIC ALIGNERS

[75] Inventors: J. Brett Rolfson; David A. Cathey, both of Boise, Id.

[73] Assignee: Micron Technology, Inc., Boise, Id.

[21] Appl. No.: 927,210

[22] Filed: Aug. 5, 1992

[51] Int. Cl.$^5$ .............................................. G03F 9/00
[52] U.S. Cl. ..................................... 430/5; 430/321; 356/416
[58] Field of Search ....................... 430/22, 31, 5, 269, 430/321; 356/416

[56] References Cited

U.S. PATENT DOCUMENTS

| | | | |
|---|---|---|---|
| 4,859,063 | 8/1989 | Fay et al. | 356/418 |
| 4,950,569 | 8/1990 | May | 430/31 |

FOREIGN PATENT DOCUMENTS 2-260412 10/1990 Japan.
3-144453 6/1991 Japan.

OTHER PUBLICATIONS

"Lithography's Leading Edge, Part 1: Phase-shift Technology,", P. Burggraaf, Semiconductor International, Feb. 1992, pp. 42–47.

"Lithography's Leading Edge, Part 2: I-line and Beyond," P. Burggraaf, Semiconductor International, Mar. 1992, pp. 52–56.

*Primary Examiner*—Steve Rosasco
*Attorney, Agent, or Firm*—Stoel, Rives, Boley, Jones & Grey

[57] ABSTRACT

A removable bandpass filter layer (22), which is preferably part of a pattern transfer tool (10), improves the resolution of a semiconductor wafer aligner that uses a relatively broad bandwidth radiation source. A narrower bandwidth filter layer provides more complete destructive interference of undesirable diffraction patterns when it is used with a phase-shift pattern transfer tool and removes radiation of longer wavelengths to improve resolution when it is used with a nonphase-shift pattern transfer tool. Using a removable bandpass filter layer, rather than permanently installing a narrow bandpass filter in the aligner, does not affect the speed of patterning layers that do not require the enhanced resolution. The same aligner can thus be used for either high resolution or high throughput without substantial modification to the aligner.

20 Claims, 2 Drawing Sheets

REMOVABLE BANDPASS FILTER FOR MICROLITHOGRAPHIC ALIGNERS

TECHNICAL FIELD

This invention relates to the field of microlithography for integrated circuits and, in particular, to a removable bandpass filter for selectively enhancing resolution.

BACKGROUND OF THE INVENTION

Microlithographic processes are typically used to fabricate integrated circuits on semiconductor wafers. A photosensitive layer known as photoresist is applied to the wafer, patterned by exposure to radiation through a pattern transfer tool in an aligner system or aligner, and subsequently developed. The pattern transfer tool typically includes a pattern composed of opaque and transparent areas that are to be transferred to the wafer surface. The tool is inserted into the aligner and is readily removable for interchanging with other tools having other patterns. Radiation energy passes through the pattern transfer tool to the photoresist layer and induces a chemical reaction therein. The exposure continues until a quantity of radiation energy sufficient to induce the chemical reaction throughout the depth of the photoresist layer has been transferred.

Microlithographic processes for fabricating integrated circuits are continually being improved to allow the manufacture of ever smaller devices to increase device speed and density on a chip. Faster and denser chips lead to more powerful and less expensive electronic products. The minimum device size that can be printed by a process is determined by its resolution capability, i.e., the minimum line width the process can print.

The resolution capability of microlithographic processes is ultimately limited by undesirable diffraction effects of the radiation as it passes through the pattern transfer tool. The theoretical smallest distance an aligner can resolve is known as the Rayleigh limit and is described by the Rayleigh equation:

$$R_{min} = \frac{k1 * \lambda}{NA}$$

where $R_{min}$ is the minimum resolution, i.e., the minimum separation of two barely resolvable objects, k1 is a process dependent constant, $\lambda$ is the wavelength of exposing radiation and NA is the numerical aperture, a measure of the ability of the optics of the aligner to collect diffracted light from the tool and project it onto the wafer. Because the Rayleigh limit is proportional to the wavelength of exposing radiation, one method of improving resolution is to use radiation of a shorter wavelength.

Current aligner systems typically use light of the 436 nm "g-line" or the 365 nm "i-line" of a mercury vapor lamp. X-ray systems, having wavelengths of 0.4 nm to 5.0 nm, are not yet fully developed as production tools. Deep ultra-violet systems, having wavelengths of about 250 nm are now available, but such systems are expensive and not fully proven in a production environment.

Another method for improving resolution is to decrease the value of k1 in the Rayleigh equation by using destructive interference to modify the diffraction pattern. This is accomplished typically by shifting the phase of a portion of the radiation passing through the pattern transfer tool in such a way that the diffraction patterns of the phase-shifted and nonphase-shifted portions destructively interfere. This phase-shift technique can decrease the value of k1 in the Rayleigh equation from approximately 0.60 to approximately 0.35 for some types of "i-line" aligners. Another advantage of the phase-shift technique is that it does not require an expensive new aligner system to improve resolution; the pattern transfer tool alone is modified.

However, radiation of different wavelengths is phase-shifted by different amounts as it passes through the pattern transfer tool. Because the tool is typically tuned to the center wavelength of the illuminating bandwidth, radiation having a wavelength different from the center wavelength will not be phase-shifted by the desired amount. The deviation from the desired amount of phase-shift for a particular wavelength is proportional to the difference between that wavelength and the center wavelength. Therefore, the ability of the radiation to destructively interfere depends upon the light being essentially of a single wavelength, i.e., having a narrow bandwidth.

Narrowing the bandwidth increases, however, the time required to expose the photosensitive layer because the radiation energy is being transferred to the photoresist layer at a slower rate. Because aligners process wafers individually, lengthening the exposure step can create a bottleneck in the entire wafer fabrication process.

Two primary types of aligner systems are used in the fabrication of very large scale integrated circuits—scanning projection aligners and step-and-repeat aligners, or "steppers." Some scanning projection aligners, such as the Micralign TM aligner manufactured by SVG Lithography ("SVG-L"), use a pattern transfer tool called a mask that includes a pattern that is transferred to the entire wafer in one printing step. Other scanning systems, such as the SVG-L Micrascan TM aligner, use a pattern transfer tool with an enlarged pattern and scan this image several times over a semiconductor wafer in order to transfer the pattern over the entire wafer substrate.

Steppers use a pattern transfer tool called a reticle that typically includes an enlarged pattern that is reduced and transferred to a portion of the wafer. Steppers step across the wafer, repeatedly transferring the image of the reticle at different consecutive locations on the wafer. Another form of stepper, such as an Ultratech TM Stepper, uses a pattern transfer tool having the same size image as is printed on the semiconductor workpiece, and steps this image several times upon the workpiece in order to fully cover it.

Bandpass filters are currently used in exposure tools with refractive optics in order to narrow the bandwidth of the exposing radiation. Refractive optics must use a narrow bandwidth of light in order to properly focus the exposing radiation within the optical train. Broadband exposure wavelengths will not focus properly. For this reason, refractive optics will require more time to expose the wafer, for a given light-source power input, than would a broadband, reflective optics systems.

Scanning projection aligners, or those utilizing reflective optics, are designed to pass a relatively broad band of light to achieve light intensities that will more quickly expose the photoresist. These aligners use internal broadband bandpass filters, but such reflective optical systems do not use narrow bandpass filters because mirrors are used to focus an image of the mask onto the wafer, and excessive narrowing of the exposure bandwidth would unnecessarily slow wafer production.

SUMMARY OF THE INVENTION

An object of the present invention is, therefore, to provide an apparatus and a method for selectively improving the resolution of microlithography aligners.

Another object of this invention is to provide such a method that requires minimal modification of the aligner and does not slow the functioning of the aligner when the high resolution method is not being practiced.

A further object of this invention is to enhance the resolution of existing aligners to eliminate the need to purchase new equipment for patterning smaller lines.

Still another object of this invention is to improve the performance of phase-shift pattern transfer tools.

The present invention relates to an apparatus and a method for improving the resolution of semiconductor wafer microlithography aligners. The invention uses a bandpass filter layer that is easily removable from the aligner to narrow the bandwidth of radiation reaching the photoresist. In a preferred embodiment, the bandpass filter layer is located on or adjacent to the pattern transfer tool. The pattern transfer tool is preferably a phase-shift tool for use in a scanning projection aligner having a relatively broad bandwidth illumination source. The narrower bandwidth of this invention allows more complete destructive interference of undesirable diffraction patterns, resulting in higher resolution.

This invention also improves the resolution of aligners using nonphase-shift pattern transfer tools by decreasing or eliminating the transmission through the pattern transfer tool of exposing radiation having longer wavelengths, thereby shortening the wavelength of the exposing radiation reaching the photoresist on the wafer surface and improving the minimum resolution defined by the Rayleigh limit.

The removable bandpass filter increases the versatility of the aligner because it can use the bandpass filter when higher resolution is required or it can operate with the filter removed for higher throughput.

The invention allows the use of broad bandwidth scanning projection aligners for high resolution microlithography, thus eliminating the need to purchase costly new aligners. The invention also increases the resolution and versatility of aligners having smaller bandwidths by further decreasing the bandwidths.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 1:
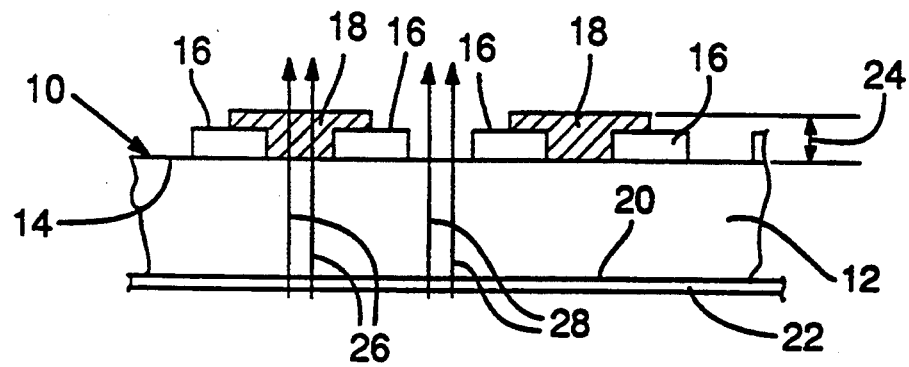
FIG. 1 is a fragmentary side elevation view of a preferred pattern transfer tool having a removable bandpass filter layer of the current invention.

FIG. 1 shows a portion of a preferred pattern transfer tool 10 comprising an optically transparent supporting substrate 12 that supports on a first surface 14 an opaque masking layer 16 and a phase-shift layer 18 and on a second, opposing surface 20, a bandpass radiation filter layer 22. In a preferred embodiment, substrate 12 is composed of quartz; masking layer 16 is composed of chromium; phase-shifting layer 18 is composed of silicon dioxide; and bandpass layer 22 is composed of magnesium fluoride. Use of both layers 16 and 18 is preferred, but not required to practice the invention.

Phase-shifting layer 18 has a thickness 24 of an amount that shifts the phase of a first portion of exposing radiation 26 transmitted through layer 18 by approximately an odd integral multiple of $\pi$ relative to a second portion of radiation 28 that does not pass through layer 18. Such a phase-shift occurs when the thickness "t" is equal to:

$$t = \frac{i\lambda}{2(n-1)}$$

where i is an odd integer, $\lambda$ is the wavelength of the exposing radiation, n is the refractive index of layer 18, and 1 is the assumed index of refraction of air which surrounds the pattern transfer tool and which radiation 28 traverses instead of layer 18. A small value of i is chosen to minimize absorption losses by keeping layer 18 thin.

Minimizing absorption losses maintains approximately equal and opposite electric field values for the phase-shifted and nonphase-shifted radiation, thereby producing more complete destructive interference of undesirable diffraction patterns. For example, using a silicon dioxide layer having a refractive index of 1.47 and a 436 nm "g-line" source, the thickness is preferably 4640Å. The value of $\lambda$ used corresponds to the peak transmission frequency of bandpass filter layer 22.

Figure 2:
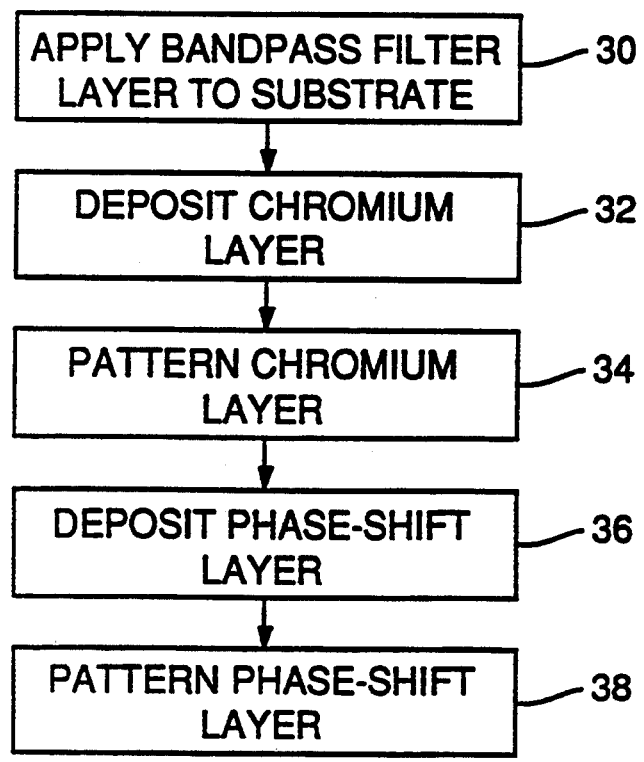
FIG. 2 is a flow chart of the preferred method for making the pattern transfer tool of FIG. 1.

FIG. 2 shows the preferred process steps to form pattern transfer tool 10 shown in FIG. 1. Process step 30 represents the application of bandpass filter layer 22 to surface 20 of substrate 12 by evaporation, sputtering or chemical deposition techniques. Quartz is the preferred material for substrate 12 because of its superior thermal stability, but other transparent, thermally stable materials, such as borosilicate glass can also be used. Bandpass filter layer 22 is composed of a material that has the desired optical properties, is capable of withstanding normal pattern transfer tool cleaning procedures and associated chemicals, and is capable of withstanding heat created when radiation outside the bandwidth is absorbed. Such materials include compounds of fluoride, such as magnesium fluoride, and oxides, such as those of silicon, aluminum, or selenium. The thickness of layer 22 will depend upon the desired bandpass filtering characteristics and is readily determined by skilled persons. Bandpass filter layer 22 could also be deposited onto both surfaces 20 and 14, and then either removed from or left on surface 14. Alternatively, bandpass filter layer 22 can be separated from pattern transfer tool 10, and mounted, for example, on a pellicle or a separate substrate.

Process step 32 represents the deposition of opaque layer 14, preferably by sputtering less than 1,000Å thick layer of chromium onto opposing surface 14 of substrate 12. An anti-reflective coating (not shown), such as a thin layer of chromium oxide, may be applied onto the chromium. Process step 34 indicates that the chromium layer is patterned using conventional reticle and mask making stechniques, such as e-beam or optical pattern generation. A mask can be made by first making a reticle, and then using the reticle in a step and repeat process to pattern the chromium on the mask. Mask and reticle making techniques are well known in the art.

Process steps 36 and 38 represent the formation of phase-shift layer 18. Step 36 entails the deposition of silicon dioxide onto pattern transfer tool 10 using a chemical vapor deposition or spin-on-glass process, and step 38 entails the patterning of layer 18 by processes similar to those used in process step 34. Layer 18 can also be formed from silicon nitride ($Si_3N_4$), indium oxide, indium tin oxide, or other material which is essentially transparent to the exposing radiation and not adversely affected by pattern transfer tool cleaning procedures and associated chemicals.

Figure 3:
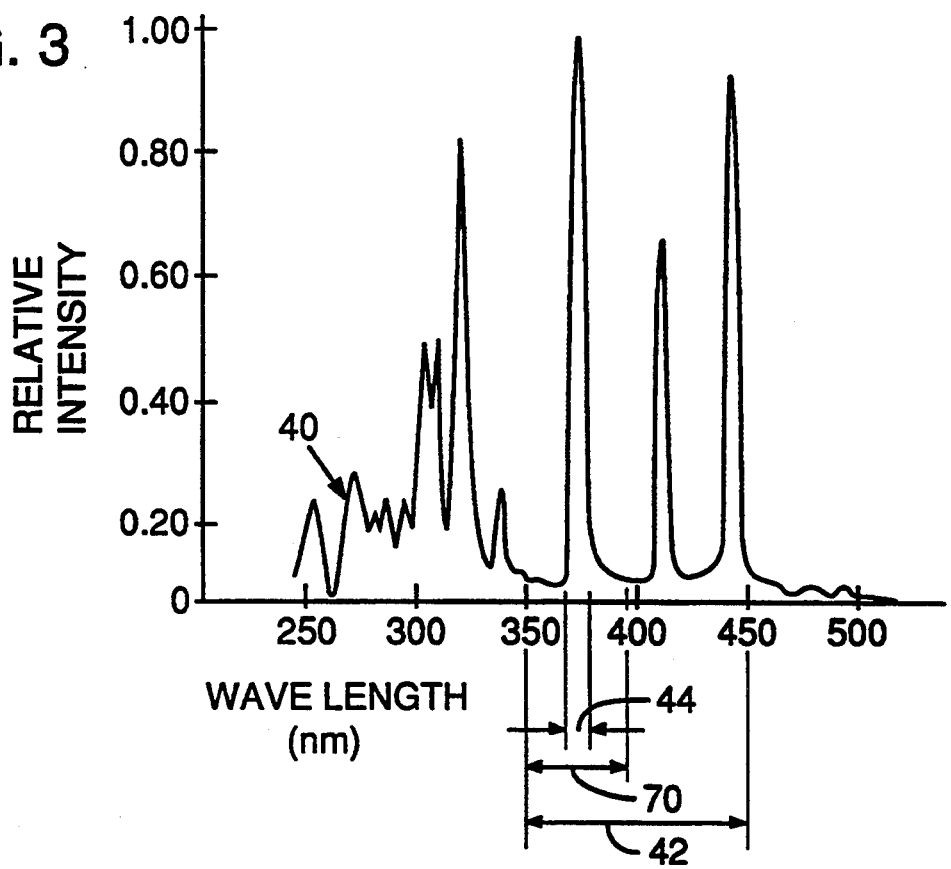
FIG. 3 shows a partial spectrum of light emitted by a broadband source and bandwidths before and after passing through pattern transfer tools having a bandpass filter.

The order of the process steps required to make pattern transfer tool 10 can vary from that shown in FIG. 3. Layers 16, 18, and 22 can be formed in virtually any order, and the invention can be made without one of layers 16 or 18.

Layer 18 can also be formed by etching into substrate 12. If layer 18 is deposited, the longer optical path through layer 18 retards the light passing through the layer, causing it to be out of phase relative to light that did not pass through layer 18. If layer 18 is etched, the shorter optical path through the etched areas causes the light passing them to be less retarded and therefore out of phase relative to light passing through the full thickness of substrate 12.

FIG. 3 shows a typical spectrum 40 of illuminating light from a typical broadband mercury vapor light source, such as that used in an SVG-L Micralign TM aligner system. The light has a typical bandwidth 42 before and a typical bandwidth 44 after passing through pattern transfer tool 10 of the present invention. By reducing the bandwidth of the radiation as it passes through pattern transfer tool 10 having phase shift layer 18, the destructive interference is more complete, and the diffraction pattern on the wafer is improved, thereby improving the resolution. The material of bandpass layer 22 transmits light having a wavelength within narrow bandwidth 44, preferably within no greater than ±5 μm about the bandwidth center 44, and absorbs radiation outside of bandwidth 44. Some aligners may require additional cooling capacity to remove heat created by the absorption of radiation by layer 22.

Figure 4:
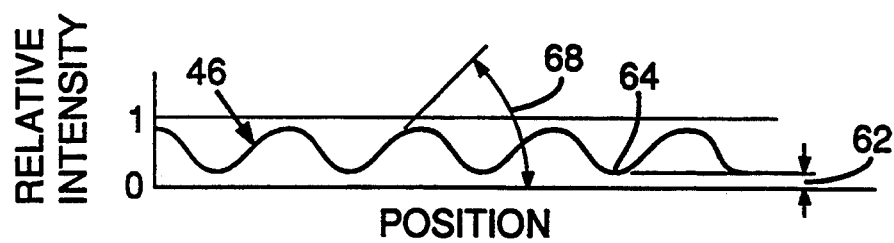
FIG. 4 shows qualitatively an intensity pattern of light at a photoresist layer after passing through a phase-shift pattern tool pattern similar to that of the tool in FIG. 1, but without a bandpass filter layer.
Figure 5:
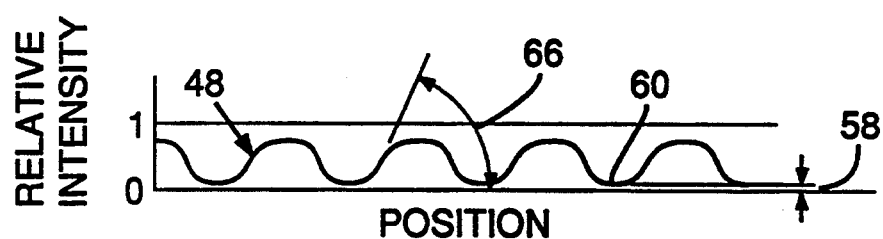
FIG. 5 shows qualitatively an intensity pattern of light at a photoresist layer after passing through the phase-shift pattern transfer tool of FIG. 1.
Figure 6:
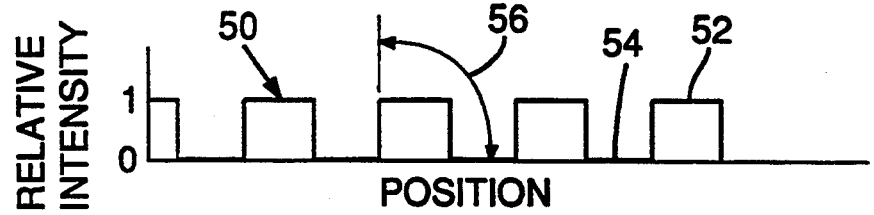
FIG. 6 shows an ideal intensity pattern of light at a wafer surface.

FIG. 4 shows a qualitative representation of a light intensity pattern 46 at the photoresist layer from a phase-shift tool similar to that shown in FIG. 1, but having no bandpass filter layer 22. FIG. 5 shows a qualitative representation of a light intensity distribution 48 of the tool in FIG. 1 including bandpass filter layer 22. An ideal light intensity pattern 50, capable of producing a sharp, narrow line width is shown in FIG. 6. Such a binary pattern is ideal because the photoresist is exposed to a high intensity 52 of light where exposure is required and zero intensity 54 where exposure is not required. There are no areas of partial exposure because the slope 56 of the light intensity curve between light and dark areas is 90°.

A comparison of FIGS. 4 and 5 shows that the intensity pattern shown in FIG. 5 from a pattern transfer tool including filter layer 22 is closer to the ideal pattern. The intensity 58 of light reaching the wafer in the darkest areas 60 is lower than the intensity 62 of light reaching the darkest areas 64 without filter 22. Thus, the contrast of the image is improved by using bandpass filter 22. The slope 66 of the intensity curve with filter 22 is steeper than the slope 68 of the intensity curve without filter 22, thus narrowing undesirable areas of partial exposure.

In the case of an aligner using pattern transfer tool 10 without phase-shift layer 18, the resolution is improved by decreasing the wavelength of exposing radiation. For example, an SVG-L Micralign TM aligner system typically uses a relatively broad band of exposing radiation bandwidth 42 from approximately 340 nm to approximately 450 nm as shown in FIG. 3. Bandpass filter 22 could, for example, pass a narrower bandwidth 70 from 340 nm to 380 nm. Eliminating wavelengths above 380 results in exposing radiation having a shorter wavelength and, therefore, improves the Rayleigh resolution limit of the aligner.

It will be obvious that many changes may be made to the above-described details of the invention without departing from the underlying principles thereof. The surface of substrate 12 on which the various layers are formed and the order of formation can be varied considerably. For example, bandpass layer 22 can be applied to the same surface 14 of substrate 12 as opaque layer 16. Layer 22 can be applied over opaque layer 16 and phase-shift layer 18 on surface 14. Bandpass layer 22 can also be deposited on both sides of pattern transfer tool 10. Layer 22 could be applied to both sides and then optionally removed from either side.

The invention can be used with any type of phase-shift pattern transfer tool, such as one that has an opaque layer 16 above phase-shift layer 18 or one without an opaque layer 16. The invention can also be used with radiation sources of different types using materials appropriate to the radiation source to form bandpass filter layer 22.

The scope of the present invention should, therefore, be determined only by the following claims.

We claim:

1. A pattern transfer tool for use with a microlithographic aligner system to selectively improve its resolution for the fabrication of semiconductor wafers, the aligner system including a fixed first bandpass radiation filter, the pattern transfer tool comprising:
   a transparent supporting substrate; and
   a second bandpass radiation filter layer positioned in optical series with the first bandpass radiation filter, the second bandpass filter being removable from the microlithographic aligner system and having a pass band overlapping that of the first bandpass radiation filter to selectively limit wavelengths of exposing radiation received from the fixed first bandpass filter and transmitted through the pattern transfer tool when improved resolution is desired.

2. The pattern transfer tool of claim 1 in which the second bandpass radiation filter layer is supported by the substrate.

3. The pattern transfer tool of claim 1 in which the second bandpass radiation filter layer includes a compound of fluorine.

4. The pattern transfer tool of claim 1 in which the second bandpass radiation filter layer includes a compound of oxygen.

5. The pattern transfer tool of claim 1 in which the material comprising the second bandpass radiation filter layer is selected from the group consisting of magnesium fluoride, aluminum oxides, silicon oxides, and selenium oxides.

6. The pattern transfer tool of claim 1, further comprising an opaque layer supported by the substrate.

7. The pattern transfer tool of claim 1, further comprising a phase-shifting layer supported by the substrate.

8. The pattern transfer tool of claim 7 in which the phase-shifting layer includes an oxide.

9. The pattern transfer tool of claim 7 in which the phase-shifting layer includes a nitride.

10. The pattern transfer tool of claim 7 in which the material comprising the phase-shifting layer is selected from the group consisting of silicon nitride, indium oxide, and indium tin oxide.

11. A method for selectively changing the resolution of a microlithographic aligner system using an exposing radiation source providing a relatively broad bandwidth of exposing radiation, comprising:
providing a microlithographic aligner including a fixed first bandpass radiation filter decreasing the bandwidth of the exposing radiation from that of the radiation source; and
selectively positioning within the microlithographic aligner in optical series with the first bandpass filter a removable, second bandpass filter having a pass band that overlaps that of the first bandpass filter to selectively further decrease the bandwidth of the exposing radiation received from the fixed first bandpass filter, thereby allowing the aligner to be operable as a high resolution aligner with the bandpass filter in place or a high throughput aligner with the bandpass filter removed without substantial modification to the aligner.

12. The method of claim 11 in which the second bandpass filter is positioned adjacent to a pattern transfer tool.

13. The method of claim 11 in which the second bandpass filter is deposited onto a pattern transfer tool.

14. A method for improving the resolution of a semiconductor wafer microlithographic aligner that includes a radiation source emitting a relatively broad bandwidth of exposing radiation and a pattern transfer tool, comprising:
reducing the bandwidth of the exposing radiation as it passes through the pattern transfer tool, thereby improving the pattern on the wafer.

15. The method of claim 14 in which reducing the bandwidth includes absorbing at the pattern transfer tool exposing radiation outside of the desired bandwidth.

16. The method of claim 14, further comprising shifting the phase of a first portion of exposing radiation passing through the pattern transfer tool relative to a second portion of exposing radiation passing through the tool.

17. The method of claim 14 in which reducing the bandwidth of the exposing radiation includes reducing the maximum wavelength of the exposing radiation.

18. The method of claim 14 in which reducing the bandwidth of the exposing radiation includes shifting the center of the bandwidth to a shorter wavelength.

19. A microlithographic aligner system having selectively improved resolution for the fabrication of semiconductor wafers, comprising:
a radiation source providing exposing radiation having a relatively broad bandwidth;
a first bandpass radiation filter for reducing the bandwidth of the exposing radiation produced by the radiation source; and
a second, removable bandpass radiation filter receiving radiation from the first bandpass filter and further reducing the bandwidth of the exposing radiation, thereby allowing the aligner to be operable as a high resolution aligner with the second bandpass filter in place or a high throughput aligner with the bandpass filter removed without substantial modification to the aligner.

20. A pattern transfer tool for use with a microlithographic aligner system to selectively improve its resolution for the fabrication of semiconductor wafers, comprising:
a transparent supporting substrate; and
a bandpass filter layer positioned on the substrate and reducing the bandwidth of radiation passing through the pattern transfer tool.

* * * * *